United States Patent
Ma et al.

(10) Patent No.: US 6,764,810 B2
(45) Date of Patent: Jul. 20, 2004

(54) METHOD FOR DUAL-DAMASCENE FORMATION USING A VIA PLUG

(75) Inventors: Ching-Tien Ma, Tainan (TW); Tsung-Chuan Chen, Tainan (TW); Chun-Liang Fan, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 105 days.

(21) Appl. No.: 10/132,432

(22) Filed: Apr. 25, 2002

(65) Prior Publication Data

US 2003/0203321 A1 Oct. 30, 2003

(51) Int. Cl.$^7$ ................................................ G03F 7/26
(52) U.S. Cl. ........................ 430/313; 430/317; 430/329
(58) Field of Search ................................ 430/311, 313, 430/317, 318, 329, 394

(56) References Cited

U.S. PATENT DOCUMENTS 6,211,068 B1 * 4/2001 Huang ......................... 438/634
2002/0045107 A1 * 4/2002 Holscher ........................ 430/5

* cited by examiner

Primary Examiner—Kathleen Duda
(74) Attorney, Agent, or Firm—Tung & Associates

(57) ABSTRACT

A method for improving a photolithographic patterning process in a dual damascene process including providing at least one via opening in a substrate including a low dielectric constant material; blanket depositing a photo-sensitive resinous layer to fill the at least one via opening; partially removing the photo-sensitive resinous layer to form an at least partially filled via plug; photo-curing the via plug such that an activating light source causes a polymer cross-linking chemical reaction; and, forming a trench line opening disposed substantially over the at least one via opening using a trench line photoresist to pattern the trench line opening.

20 Claims, 2 Drawing Sheets

METHOD FOR DUAL-DAMASCENE FORMATION USING A VIA PLUG

FIELD OF THE INVENTION

This invention generally relates to photolithographic patterning of semiconductor features and more particularly to an improved method for manufacturing features such as dual damascene structures while eliminating problems caused by undeveloped photoresist.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate interfering effects occurring in the semiconductor wafer manufacturing process.

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as vias, i.e., when the hole extends through an insulating layer between two conductive areas. Metal interconnecting lines (trench lines) are typically formed over the vias to electrically interconnect the various semiconductor devices within and between multiple layers. The damascene process is a well known semiconductor fabrication method for forming electrical interconnects between layers by forming vias and trench lines.

For example, in the dual damascene process, a via is etched in an insulating layer also known as an inter-metal or inter-level dielectric (IMD/ILD) layer. The insulating layer is typically formed over a metal or conductive layer. After a series of photolithographic steps defining via openings and trench openings, the via openings and the trench openings are filled with a metal (e.g., Al, Cu) to form vias and trench lines, respectively. The excess metal above the trench level is then removed by well known chemical-mechanical polishing (CMP) processes.

After the via holes are etched, but before the holes are filled with a conductive material, for example, copper, the photoresist mask which remains on top of the desired features may be removed by a dry etching method known as a reactive ion etch (RIE) or ashing process using a plasma formed of $O_2$ or a combination of $CF_4$ and $O_2$ to react with the photoresist material.

As feature sizes in etching process have become increasingly smaller, photolithographic processes have been required to use photoresist activating light (radiation) of smaller wavelength. Typically a deep ultraviolet (DUV) activating light source with wavelength less than about 250, but more typically, from about 193 nm to about 230 nm is used. Exemplary DUV photoresists, for example, include PMMA and polybutene sulfone.

One problem affecting DUV photoresist processes has been the interference of residual nitrogen-containing species with the DUV photoresist. Residual nitrogen-containing contamination is one of the greater concerns in the use or application of metal nitride films such as silicon nitride or silicon oxynitride as hard mask layer or silicon oxynitride as a DARC. For example, nitrogen radicals created due to the presence of nitrogen containing species, such as amines, interfere with chemically amplified resists by neutralizing the acid catalyst, thereby rendering that portion of the photoresist insoluble in the developer. As a result, residual photoresist may remain on patterned feature edges, walls, or floors of features, affecting subsequent etching or metal filling processes thereby degrading electrical property functionality by causing, for example, electrical open circuits or increased resistivity.

Another aspect of advances in semiconductor device processing technology that exacerbates the problem is the increasing use of low-k (low dielectric constant) insulating materials that make up the bulk of a multilayer device. Low-k materials are increasingly used in, for example insulating (IMD) layers to reduce signal delays caused by parasitic capacitance effects. Many of the low-k materials are designed with a high degree of porosity including interconnecting porosity to allow the achievement of lower dielectric constants. The problem of absorption chemical species that interfere with subsequent processes is exacerbated by the tendency of porous low-k materials to readily absorb and transport such chemical species.

There is therefore a need in the semiconductor processing art to develop a method whereby reliable photolithography processes may be carried out without the-detrimental effects of photoresist poisoning.

It is therefore an object of the invention to provide a method whereby reliable photolithography processes may be carried out without the detrimental effects of photoresist poisoning while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving a photolithographic patterning process in a dual damascene process.

In a first embodiment, the method includes providing at least one via opening in a substrate including a low dielectric constant material; blanket depositing a photo-sensitive resinous layer to fill the at least one via opening; partially removing the photo-sensitive resinous layer to form an at least partially filled via plug; photo-curing the via plug such that an activating light source causes a polymer cross-linking chemical reaction; and, forming a trench line opening disposed substantially over the at least one via opening using a trench line photoresist to pattern the trench line opening.

These and other embodiments, aspects and features of the invention will become better understood from a detailed description of the preferred embodiments of the invention which are described below in conjunction with the accompanying drawings.

DETAILED DESCRIPTION OF THE PREFERRED EMBODIMENTS

It has been found according to the present invention absorbed chemical species affecting subsequent plasma etching process may be inhibited by forming a photosensitive resinous layer to fill the via opening thereby forming a via plug prior to etching an overlying trench opening after forming a second photoresist layer for patterning the trench line pattern. It has been found that a photo-curing process is preferable to a thermal treatment process due to undesired reactions during subsequent plasma etching processes between the trench layer photoresist and the incompletely cured resinous via plug material. While the invention is explained with reference to a dual damascene process, it will be appreciated that the same concept can be applied to the formation of any semiconductor feature where it would be advantageous to prevent adsorption of chemical species by formation of a resinous plug in all or part of a semiconductor feature and where it would be advantageous to prevent undesired reactions between resinous materials in subsequent plasma etching processes due to an incomplete thermal curing process.

The various embodiments of the invention are explained below by reference to a process for forming a dual damascene structure as follows.

Figure 1A:
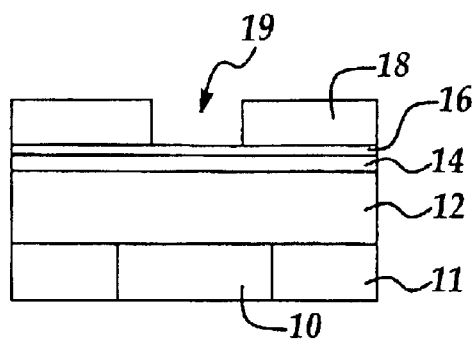
FIGS. 1A–1H are representative cross sectional side views of portions of a dual damascene structure at stages in the manufacturing process according to the present invention.

For example, referring to FIG. 1A, is shown a portion of a dual damascene structure, for example, including a conductive region 10, for example, copper, formed in an insulating layer 11 and an overlying insulating (IMD) layer 12, for example a low-k carbon doped silicon dioxide. Several different insulating materials may be used in the IMD layer, typically though, a low-k (low dielectric constant material) such as carbon doped silicon dioxide (C-oxide) is preferred. Typically, the dielectric constant of the low-k material is less than about 3.0. It will be appreciated that other low-k materials may be used and that the method according to the present invention is likewise applicable to those materials, particularly if they are porous materials. Additional exemplary low-k inorganic materials include, for example, porous oxides, xerogels, or SOG (spin-on glass). Exemplary low-k organic materials include, for example, polysilsequioxane, parylene, polyimide, benzocyclobutene amorphous Teflon, and spin-on polymer (SOP).

A metal nitride etching stop layer (hard mask layer) 14, for example, silicon nitride (e.g., $Si_3N_4$) or silicon oxynitride (e.g., SiON) is deposited over the IMD layer 12. The metal nitride layer is typically deposited by a (chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen. The process includes oxygen in the case the metal nitride is oxygen containing, such as silicon oxynitride, under conditions that are well known in the art.

A dielectric anti-reflective coating (DARC) layer 16 is then deposited over the hard mask layer 14, to reduce undesired light reflections in a subsequent photolithographic patterning process to define via openings. Preferably, the DARC layer 16 is silicon oxynitride (SiON), but may be other metal nitrides, such as titanium nitride (e.g., TiN). The DARC layer 16 and the hard mask layer 14 each are typically within a thickness range of about 200 to about 1000 Angstroms.

A photoresist layer 18 is next deposited over the DARC layer and exposed and developed according to a conventional photolithographic patterning process to define via openings, for example, via opening pattern 19. Preferably, a deep ultraviolet (DUV) photoresist is used for patterning the via openings including an activating radiation source with a wavelength of less than about 250 nm, to expose the photoresist layer 18. The photoresist may be any conventional DUV photoresist including, for example, a chemically amplified resist including a photogenerated acid. There are several suitable commercially available photoresists including for example, PMMA and polybutene sulfone.

Figure 1B:
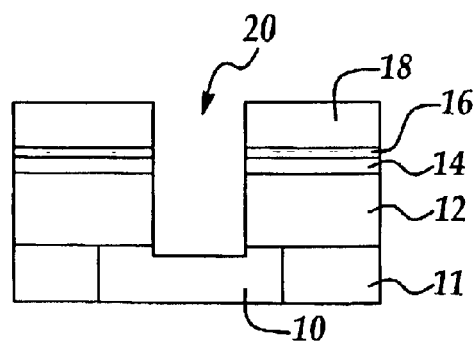

As shown in FIG. 1B, via opening 20 is anisotropically etched through a thickness of the DARC layer 16, the hard mask layer 14, and the IMD layer 12 to create an opening in closed communication with the underlying conductive region 10. The anisotropic etching is typically carried out by a conventional plasma reactive ion etch (RIE) process.

Figure 1C:
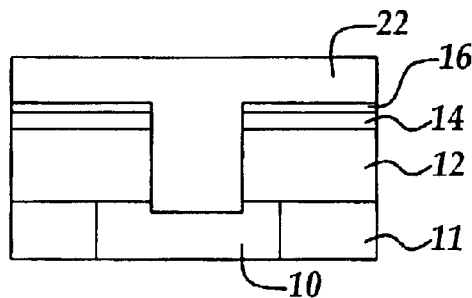

Referring to FIG. 1C, in the method according to the present invention, after removing the photoresist layer 18 by either a wet chemical process or preferably a plasma ashing process, a flowable photosensitive resinous layer 22, preferably a photoresist, more preferably the same a DUV photoresist used for subsequently patterning trench line openings, is conformally (blanket) deposited over the via opening 20 to fill the via opening 20. A conventional spin coating process may be used to apply the photosensitive resinous layer 22. The photosensitive resinous layer 22 is deposited within a thickness range of about 1000 to about 4000 Angstroms. The photosensitive resinous layer 22 filling via opening 20, operates to block out-diffusion of nitrogen containing species that have been absorbed into the low-k IMD layer 12, for example, during the deposition of metal nitride layers such as the hard mask layer 14, and DARC layer 16. As a result, interference with subsequent DUV photolithographic patterning processes, to define, for example a trench line, is avoided.

It has been found that a photosensitive resinous material, for example a photoresist, is preferably used to form the via plug thereby enabling a curing process of the photosensitive resinous material to occur by exposure to an activating wavelength of light thereby initiating cross-linking reactions between the polymer chains included in the photosensitive resinous material. It has additionally been found that the photo-curing process is preferably carried out subsequent to etching back the photosensitive resinous material to form a via plug. For example, it has been found that curing the resinous layer by a thermal treatment prior to etch-back of the resinous layer to form a via plug causes problems. For example, heat treating the resinous layer at temperatures from about 100° C. to about 160° C. prior to etch-back of resinous layer to form a via plug creates problems by causing the resinous material to react with the trench layer photoresist during trench line etching in subsequent processes. In etching the trench opening, the trench opening is incompletely etched leaving a fence of unetched resinous material around the via opening and a layer of unetched material overlying the via plug.

It is believed that incompletely cured resinous material forming the via plug may react during the plasma etching process with the DUV photoresist used to pattern the trench lines thereby "poisoning" the via. As a result, an etching resistant layer is formed along the sidewalls of the via opening thereby leaving a fence of unetched material surrounding the via opening and overlying the via opening following the trench etching process. As a result, improperly formed dual damascene structures lead to electrical opens.

Figure 1D:
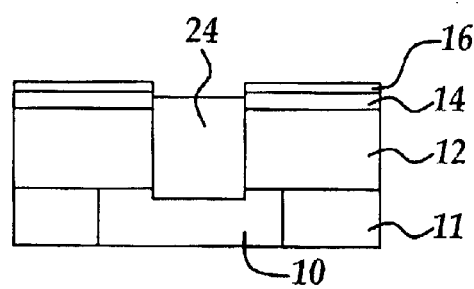

Therefore, to avoid the above problems, according to another aspect of the present invention, following deposition of the photosensitive resinous layer 22, the photosensitive resinous layer 22 is subjected to an etch-back process to form a resinous via plug prior to photo-curing the photosensitive resinous via plug. For example, referring to FIG. 1D, the photosensitive resinous layer 22 is etched back to partially remove the photoresist resinous layer 22 to form a via plug 24 at least partially filling the via opening 20, for example, extending above a bottom portion of a subsequently etched trench line opening. For example, during the etch-back procedure, the etching is preferably carried out through at least endpoint detection of the of the metal nitride SiON layer 14. The etch-back is carried out such that the via opening 20 remains at least partially filled to include at least partially covering the via sidewalls to form via plug 24 as shown in FIG. 1D. The etch-back process is carried out by a conventional RIE process, with for example an oxygen plasma or a fluorine based chemistry such as $CF_4$, and $CHF_3$ with oxygen.

Following the etch-back process, a photo-curing process is carried out whereby the via plug is exposed to an activating light source. Preferably the photo-curing process following the etch-back process is carried out in place of a thermal curing process carried out prior to the etch-back process. Less preferably, however, the photo-curing process following the etch-back may be carried out in addition to a thermal curing process prior to the etch-back procedure. It will be appreciated that the wavelength of light will depend on the wavelength of light that the photosensitive resinous via plug is sensitive to. Preferably, the photosensitive resinous plug is formed from a DUV (Deep ultraviolet) sensitive photoresist, for example, the same DUV photoresist subsequently used for patterning the trench lines thereby by simplifying processing steps. However, any photosensitive polymer may be used as long as upon exposure to an activating wavelength of light, for example, typically less than about 400 nm, a cross-linking chemical process occurs in the polymer to substantially complete a cross linking reaction throughout the photosensitive layer. Exemplary photosensitive polymers, for example, include methyl methacrylate, polyolefins, polyacetals, polycarbonates, polypropylenes and polyimides. More preferably, the photosensitive polymer is a DUV photoresist, most preferably the same as used for subsequently patterning the trench lines, including for example, PMMA and polybutene sulfone.

Figure 1E:
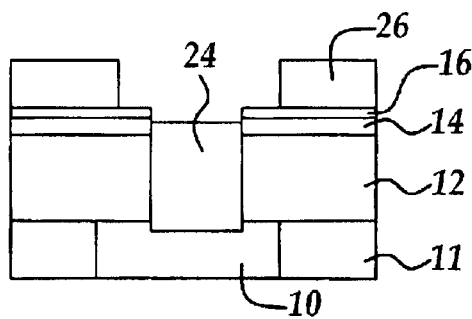

Following the etch-back process, a photoresist layer 26 (trench line photoresist) is deposited over the DARC layer 16 and photolithographically patterned by exposure and development to form a pattern for trench line formation over via plug 24 as shown in FIG. 1E. Preferably the photoresist is a DUV photoresist designed for exposure and development at a wavelength less than about 250 nm as discussed with reference to via photoresist layer 18 in FIG. 1A. As previously mentioned, the photoresist is preferably also used for forming the via plug.

Figure 1F:
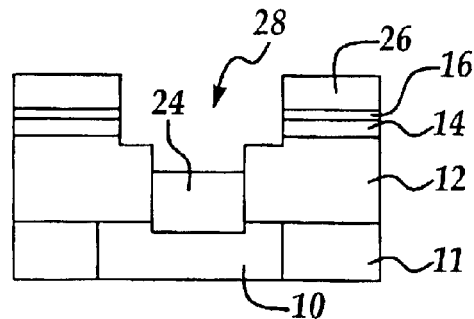
Figure 1G:
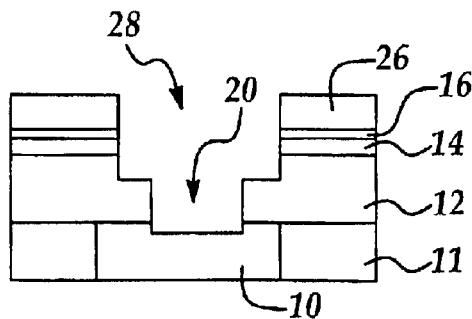

A plasma anisotropic etching process (RIE) is then carried out to etch through the exposed DARC layer 16 and etching stop (hard mask) layer 14, to include partially etching through via plug 24, and IMD layer 12 to form trench opening 28 as shown in FIG. 1F by a conventional plasma etching process.

Figure 1H:
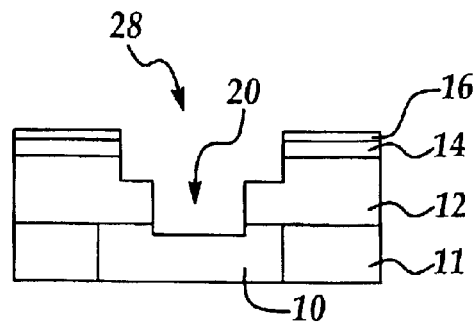

Following the trench line etching process, the trench line opening is completed by a conventional RIE ashing and cleaning process in an oxygen rich plasma to remove remaining via plug 24 from the via opening 20 and the trench line photoresist layer 26 as shown in FIG. 1H.

The dual damascene structure is typically completed forming a barrier layer (not shown) over the floor and sidewalls of the trench line opening 28 and via opening 20 followed by filling with a metal, for example copper, and planarizing with a chemical mechanical polishing (CMP) process.

Figure 2:
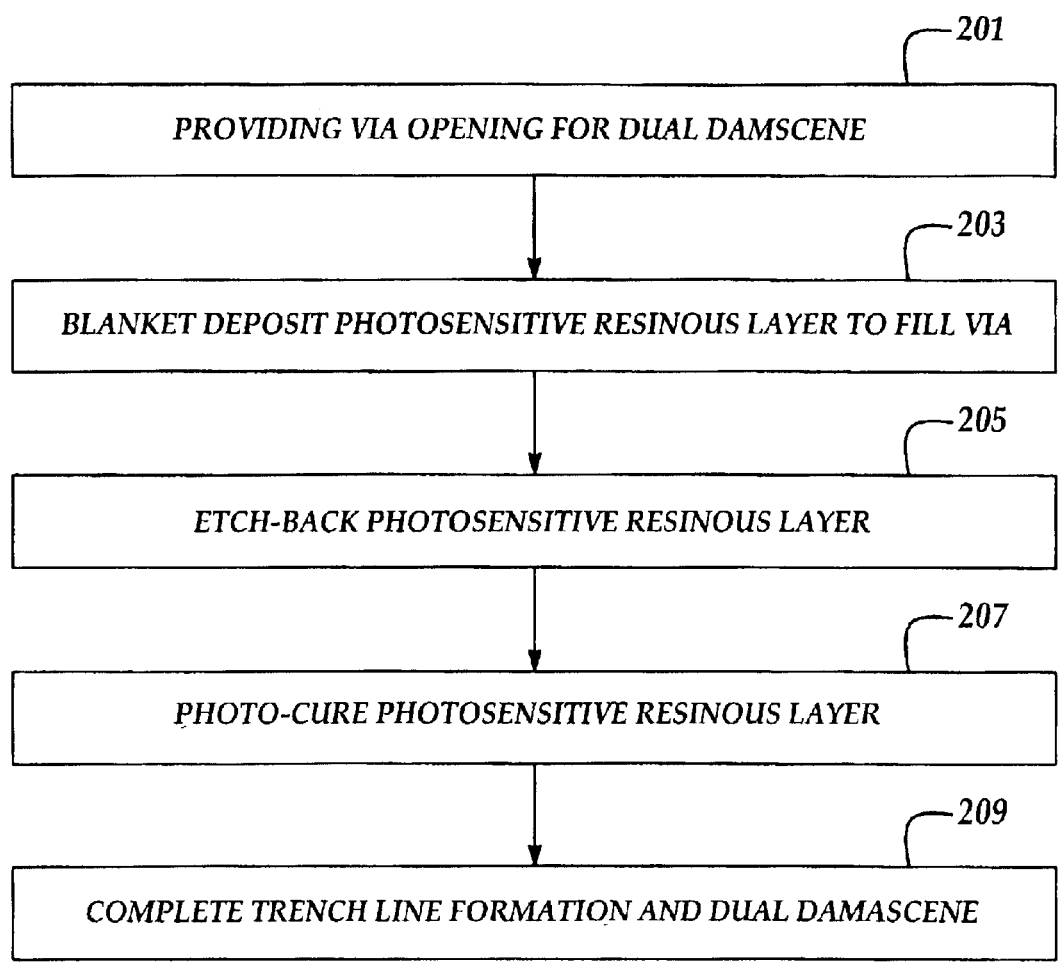
FIG. 2 is a representative process flow diagram according to one embodiment of the present invention.

In summarizing the process flow according to the present invention, reference is made to FIG. 2, where the process flow diagram begins with providing a via opening for a dual damascene process according to process 201. It will be understood that whenever reference herein is made to the singular of a semiconductor feature, for example, a via opening, that such reference includes a plurality of structures included in a semiconductor wafer. In addition it will be understood that multi-layers of similar features are formed in the semiconductor wafer, thereby requiring repeating the process steps a number of times to complete formation of a semiconductor device. According to the present invention, the via opening is filled with a conformally (blanket) deposited layer of photosensitive resinous material according to process 203. An etch-back process 205 is carried out to etch-back the photosensitive resinous layer to form via plug at least partially filling the via opening. The photosensitive resinous material forming the via plug is then photo-cured according to process 207 by exposure of the via plug to an activating light source, preferably ultraviolet light with a light source of less than about 400 nm, more preferably to a DUV light source (less than about 250 nm) where the photosensitive resinous material is a DUV photoresist. Following photo-curing, a conventional plasma etching processes 209 and other conventional process steps are carried out to form the trench opening and complete the dual damascene formation.

Thus, the method according to the present invention provides a method whereby reliable photolithography processes in, for example, a dual damascene process may be reliably carried out without the detrimental effects of photoresist poisoning caused by undeveloped photoresist remaining on patterned features. The via-plug according to the present invention operates to block out-diffusion of nitrogen containing species that have been absorbed into low-k insulating layers during the deposition of metal nitride layers, thereby obviating the interfering effects of such species with subsequent photoresist processes. In addition, the method of photo-curing the photosensitive via plug following an etch-back process operates to avoid undesired chemical reactions forming etching resistant residues thereby improving the reliability of the dual damascene structure.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for improving a photolithographic patterning and plasma etching process to avoid photoresist poisoning in a dual damascene process comprising the steps of:

providing a via opening through a substrate thickness comprising a nitride overlayer and a dielectric insulating layer;

blanket depositing a photo-sensitive resinous layer to fill the at least one via opening;

removing the photo-sensitive resinous layer to expose the overlying nitride layer and form a via plug partially filling the at least one via opening;

photo-curing the via plug to induce polymer cross-linking;

forming and patterning a trench line photoresist over the nitride overlayer for etching a trench line opening disposed substantially over the at least one via opening; and, plasma etching the trench line opening.

2. The method of claim 1, wherein the dielectric insulating layer comprises a porous material having a dielectric constant of less than about 3.0.

3. The method of claim 1, wherein the dielectric insulating layer comprises carbon doped silicon oxide.

4. The method of claim 1, wherein the photosensitive resinous layer is selected from the group consisting of methyl methacrylate, polyolefins, polyacetals, polycarbonates, polypropylenes and polyimides.

5. The method of claim 1, wherein the photosensitive resinous layer is a photoresist.

6. The method of claim 1, wherein the photosensitive resinous layer and the trench line photoresist comprise DUV photoresists.

7. The method of claim 1, wherein overlying nitride layer is selected from the group consisting of a hardmask layer and a DARC layer.

8. The method of claim 1, wherein the nitride overlayer is selected from the group consisting of silicon nitride, silicon oxynitride, and titanium nitride.

9. The method of claim 1, wherein the nitride overlayer is deposited according to a chemical vapor deposition process.

10. The method of claim 1, wherein the step of photo-curing is carried out without a thermal curing step prior to the removing step.

11. The method of claim 1, wherein the step of photo-curing is carried out in addition to a thermal curing step carried out prior to the removing step.

12. The method of claim 1, wherein the step of removing comprises a plasma etchback process.

13. A method for preventing photoresist poisoning in a plasma etching process comprising the steps of:

providing a first etched opening through a substrate thickness comprising a nitride overlayer and a porous low-K insulating layer;

blanket depositing a photo-sensitive resinous layer to fill the first etched opening;

removing the photo-sensitive resinous layer to expose the overlying nitride layer according to a plasma etchback process and form a resinous plug extending at least to a bottom level of a subsequently formed second etched opening overlying and encompassing the first etched opening;

photo-curing the via plug to induce polymer cross-linking;

forming and patterning a photoresist layer over the nitride overlayer for forming the second etched opening; and, plasma etching the second etched opening.

14. The method of claim 12, wherein the porous low-K insulating layer comprises carbon doped silicon oxide.

15. The method of claim 12, wherein the photosensitive resinous layer is selected from the group consisting of methyl methacrylate, polyolefins, polyacetals, polycarbonates, polypropylenes and polyimides.

16. The method of claim 12, wherein the photosensitive resinous layer comprises a DUV photoresist.

17. The method of claim 12, wherein overlying nitride layer is selected from the group consisting of a hardmask layer and a DARC layer.

18. The method of claim 12, wherein the nitride overlayer is selected from the group consisting of silicon nitride, silicon oxynitride, and titanium nitride.

19. The method of claim 12, wherein the step of photo-curing is carried out without a thermal curing step prior to the removing step.

20. The method of claim 12, wherein the step of photo-curing is carried out in addition to a thermal curing step carried out prior to the removing step.

* * * * *